(12) United States Patent
Park et al.

(10) Patent No.: US 8,716,094 B1
(45) Date of Patent: May 6, 2014

(54) FINFET FORMATION USING DOUBLE PATTERNING MEMORIZATION

(71) Applicant: GLOBALFOUNDRIES Inc., Grand Cayman, KY (US)

(72) Inventors: Chang Seo Park, Clifton Park, NY (US); Linus Jang, Delmar, NY (US); Jin Cho, Malta, NY (US)

(73) Assignee: Global Foundries Inc., Grand Cayman (KY)

( * ) Notice: Subject to any disclaimer, the term of this patent is extended or adjusted under 35 U.S.C. 154(b) by 0 days.

(21) Appl. No.: 13/682,769

(22) Filed: Nov. 21, 2012

(51) Int. Cl.
*H01L 21/336* (2006.01)
*H01L 21/3205* (2006.01)
*H01L 21/4763* (2006.01)
*H01L 21/311* (2006.01)

(52) U.S. Cl.
USPC ........... 438/300; 438/283; 438/587; 438/694; 438/697; 438/947

(58) Field of Classification Search
USPC ......... 438/151, 157, 197, 283, 300, 587, 694, 438/700, 702, 703, 947
See application file for complete search history.

(56) References Cited

U.S. PATENT DOCUMENTS

| | | | |
|---|---|---|---|
| 6,764,884 B1 | 7/2004 | Yu et al. | |
| 7,045,401 B2 | 5/2006 | Lee et al. | |
| 7,098,477 B2 | 8/2006 | Zhu et al. | |
| 7,315,994 B2 | 1/2008 | Aller et al. | |
| 7,384,838 B2 | 6/2008 | Hsu et al. | |
| 7,388,259 B2 | 6/2008 | Doris et al. | |
| 7,724,411 B2 | 5/2010 | Ko et al. | |
| 7,795,669 B2 | 9/2010 | Georgakos et al. | |
| 8,017,463 B2 | 9/2011 | Chang | |
| 8,183,062 B2 | 5/2012 | Funk et al. | |
| 2007/0111455 A1* | 5/2007 | Kim et al. | 438/286 |
| 2007/0296014 A1* | 12/2007 | Nakajima | 257/308 |
| 2008/0032508 A1* | 2/2008 | Chang | 438/725 |
| 2008/0135935 A1 | 6/2008 | Cho et al. | |
| 2009/0294842 A1* | 12/2009 | Juengling | 257/329 |
| 2010/0214545 A1 | 8/2010 | Funk et al. | |
| 2010/0264468 A1* | 10/2010 | Xu | 257/288 |
| 2010/0297838 A1* | 11/2010 | Chang et al. | 438/585 |
| 2012/0049294 A1* | 3/2012 | Chen et al. | 257/401 |

* cited by examiner

*Primary Examiner* — Mary Wilczewski
*Assistant Examiner* — Erik T Peterson
(74) *Attorney, Agent, or Firm* — Hunter E. Webb; Keohane & D'Alessandro

(57) ABSTRACT

Approaches for forming a FinFET device using double patterning memorization techniques are provided. Specifically, a device will initially be formed by defining a set of fins, depositing a poly-silicon layer, and depositing a hardmask. Thereafter, a front end of the line (FEOL) lithography-etch, lithography-etch (LELE) process will be performed to form a set of trenches in the device. The set of trenches will be filled with an oxide layer that is subsequently polished. Thereafter, the device is selectively etched to yield a (e.g., poly-silicon) gate pattern.

17 Claims, 6 Drawing Sheets

FINFET FORMATION USING DOUBLE PATTERNING MEMORIZATION

TECHNICAL FIELD

This invention relates generally to the field of semiconductors and, more particularly, to approaches for fabricating fin-shaped field effect transistors (FinFETs) using double patterning memorization techniques.

RELATED ART

As the semiconductor industry looks toward a 22 nm technology node, a transition from planar complimentary metal-oxide semiconductor (CMOS) transistors to a three-dimensional (3D) FinFET device architecture has been considered. Relative to planar transistors, FinFETs offer improved channel control and, therefore, reduced short channel effects. While the gate in a planar transistor sits above the channel, the gate of a FinFET wraps around the channel, providing electrostatic control from both sides. The 3D structure introduces new parasitic capacitances and new critical dimensions that must be controlled to optimize performance. As the device scales down, gate length and pitch also scale down. The device scaling has reached an era that is below the practical limit of the current most advanced deep ultraviolet light (DUV) immersion lithography system for single patterning which necessitates multiple patterning schemes.

Unfortunately, challenges exist with existing patterning techniques. Specifically, a primary approach referred to as "Litho-Freeze-Litho-Etch (LFLE)" has multiple issues. For example, two different kinds of resist that are immiscible to each other have to be used to enable succeeding lithography steps. This means gate length (Lg) control will be different for the first (L1) and the second (L2) patterns. The first (L1) pattern has higher critical dimension uniformity (CDU), line edge roughness/line width roughness (LER/LWR) values due to its inherent additional freezing process, while the second (L2) pattern has higher etch bias due to different etch resistance of the two resists. In addition, the chemical freeze process has consistently been faced with defects and performance issues. As such, existing approaches fail to provide a consistent and reliable result.

SUMMARY OF THE INVENTION

In general, the present invention provides approaches for forming a FinFET device using double patterning memorization techniques. Specifically, a device will initially be formed by defining a set of fins (e.g., over a buried oxide layer and a silicon layer), depositing a poly-silicon layer, and depositing a hardmask. Thereafter, a front end of the line (FEOL) lithography-etch, lithography-etch (LELE) process will be performed to form a set of trenches in the device. The set of trenches will be filled with an oxide layer that is subsequently polished. Thereafter, the device is selectively etched to yield a gate pattern (e.g., poly-silicon).

A first aspect of the present invention provides a method for forming a FinFET device, comprising: defining a set of fins over a silicon layer; forming a poly-silicon layer over the set of fins; forming a hardmask layer over the poly-silicon layer; performing a lithography-etch, lithography-etch process to form a set of trenches over the hardmask layer; forming an oxide layer to fill the set of trenches; polishing the oxide layer; and selectively etching the FinFET device to yield a gate pattern.

A second aspect of the present invention provides a method for forming a FinFET device, comprising: defining a set of fins over a silicon layer, the silicon layer being formed over a buried oxide layer; depositing a poly-silicon layer over the set of fins; depositing a hardmask layer over the poly-silicon layer; performing a lithography-etch, lithography-etch process to form a set of trenches over the hardmask layer; filling the set of trenches with an oxide layer; planarizing the oxide layer; and selectively etching the FinFET device to yield a gate pattern.

A third aspect of the present invention provides a method for forming a FinFET device, comprising: depositing a poly-silicon layer over a set of fins, the set of fins being formed over a silicon layer; depositing a silicon nitride hardmask layer over the poly-silicon layer; performing a front end of the line (FEOL) lithography-etch, lithography-etch process to form a set of trenches over the hardmask layer; filling the set of trenches with an oxide layer; planarizing the oxide layer; and performing a selective nitride etching to yield a poly-silicon gate pattern in the device.

BRIEF DESCRIPTION OF THE DRAWINGS

These and other features of this invention will be more readily understood from the following detailed description of the various aspects of the invention taken in conjunction with the accompanying drawings in which.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION OF THE INVENTION

Illustrative embodiments will now be described more fully herein with reference to the accompanying drawings, in which embodiments are shown. This disclosure may, however, be embodied in many different forms and should not be construed as limited to the embodiments set forth herein. Rather, these embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer) is present on a second element, such as a second structure (e.g. a second layer) wherein intervening elements, such as an interface structure (e.g. interface layer) may be present between the first element and the second element.

As indicated above, the present invention provides approaches for forming a FinFET device using double patterning memorization techniques. Specifically, a device will initially be formed by defining a set of fins (e.g., over a buried oxide layer and a silicon layer), depositing a poly-silicon layer, and depositing a hardmask. Thereafter, a front end of the line (FEOL) lithography-etch, lithography-etch (LELE) process will be performed to form a set of trenches in the device. The set of trenches will be filled with an oxide layer that is subsequently polished. Thereafter, the device is selectively etched to yield a gate pattern (e.g., poly-silicon).

Figure 1A:
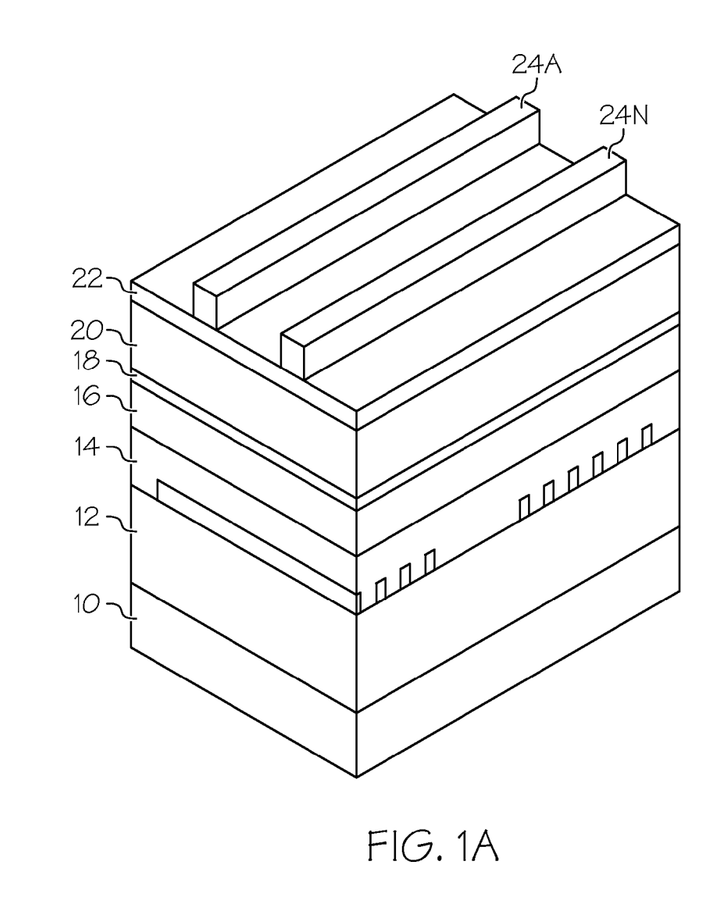
FIGS. 1A-B show a progression of a FinFET device during its formation according to an embodiment of the present invention.
Figure 1B:
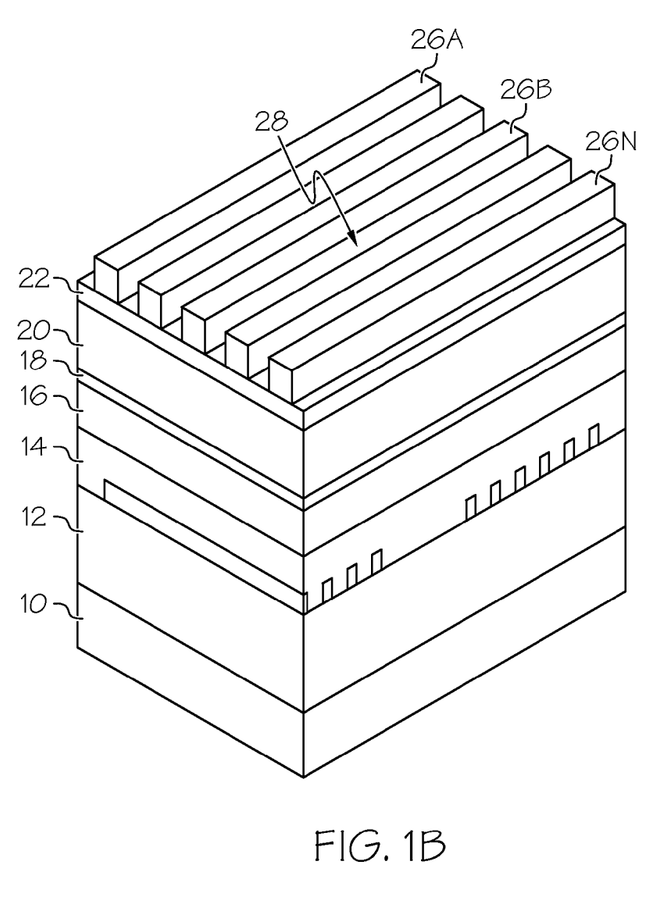

As indicated above, previous approaches generally rely on a LFLE technique in which multiple (e.g., two) different resists were utilized. An example of this is shown in FIGS. 1A-B. As depicted, a silicon layer 12 is formed over a buried oxide layer (BOX) 10. A dummy poly-silicon layer 14 is then deposited over the silicon layer 12. Over the poly-silicon layer 14, a hardmask layer will be deposited. As further shown, the hardmask layer may include multiple layers such as a nitride hardmask layer 16 and a thin oxide hardmask layer 18. Regardless, as further shown, an optical dispersive layer 20 is then formed over the hardmask layer, and a silicon-containing anti-reflexive coating (SiARC) layer 22. Then, to a pattern device, a first resist 24A-N is applied for L1, and a second resist 26A-N is applied for L2. As indicated above, the LFLE process of using two different resists 24A-N and 26A-N presents various problems such as varying etch bias and degraded device reliability.

The present invention addresses the issues in a current LFLE scheme by utilizing a front end of the line (FEOL) Lithography-Etch, Lithography-Etch (LELE) scheme. For example, as will be further described below, a first pattern (L1) and a second pattern (L2) are implemented as repeating steps from two identical single exposure patterning operations. Such an implementation will result in uniform CDU, LER/LWR values. Moreover, the final gate pattern transfer step may be triggered from a single hardmask. This is opposed to the conventional Lithography-Etch, Lithography-Etch double hardmask scheme which will suffer from an etch proximity effect (among other things). Still yet, the approach described herein utilizes unit process steps that provide a viable and reliable solution to a current high risk process scheme for gate patterning.

Figure 2A:
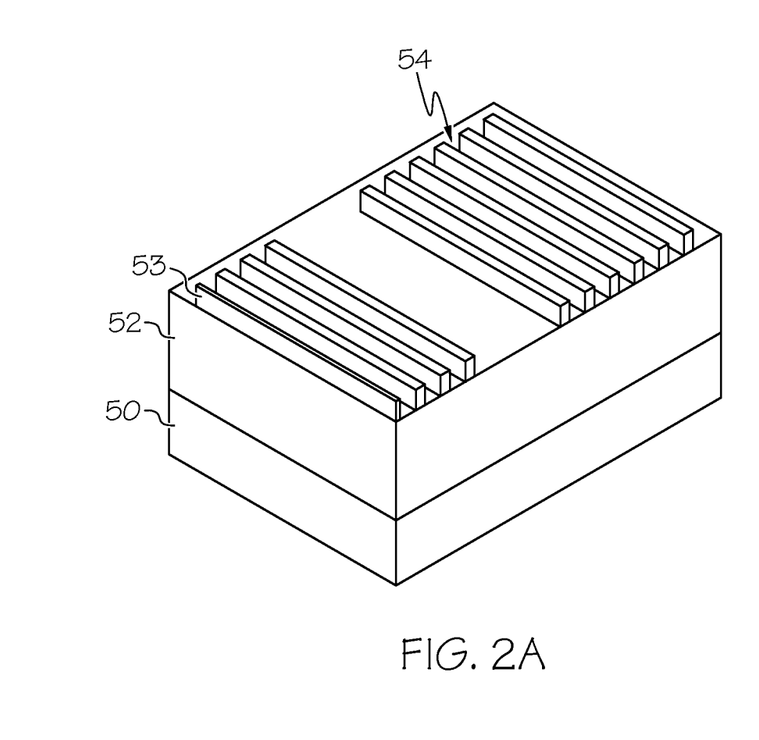
FIGS. 2A-J show a progression of a FinFET device during its formation according to an embodiment of the present invention.
Figure 2B:
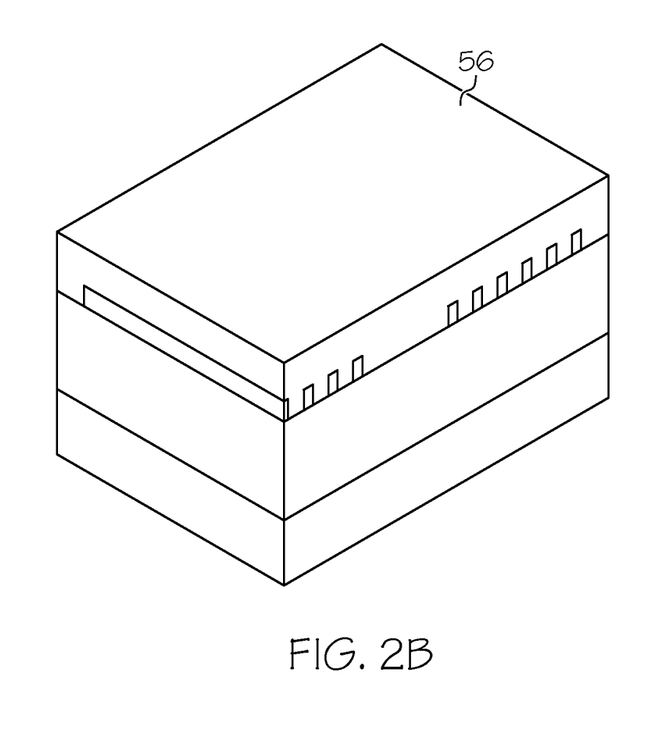
Figure 2C:
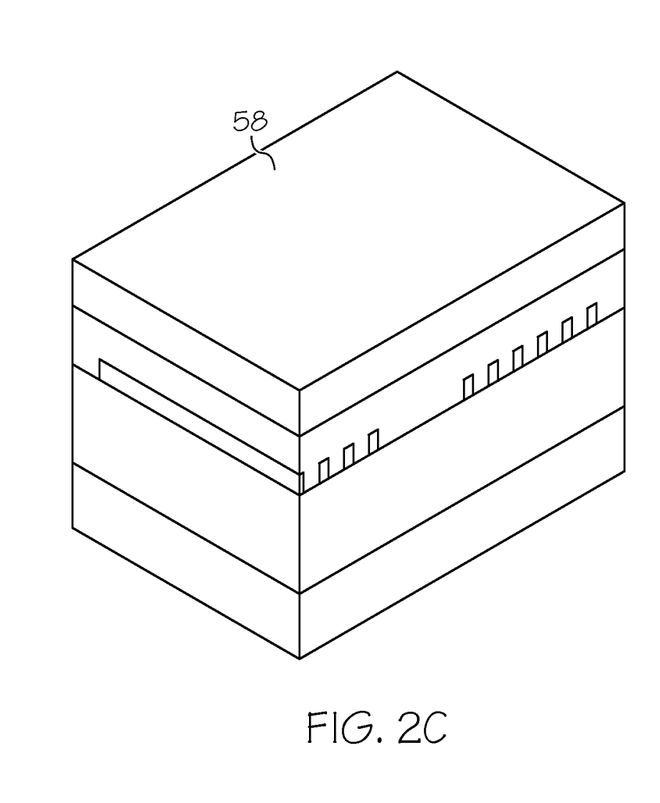
Figure 2D:
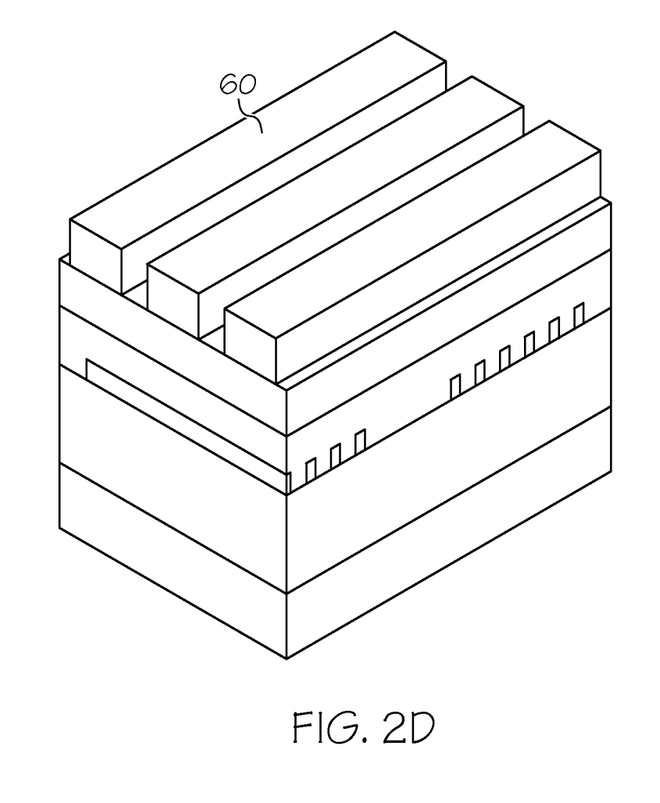

FIGS. 2A-J show a progression of a FinFET device being fabricated in accordance with at least one embodiment of the present invention. As shown in FIG. 2A, a silicon layer 52 is formed over a buried oxide layer (BOX) 50. Thereafter, a set of fins 52 are defined/formed over the silicon layer 54. As further depicted, a dummy gate oxide 53 may be applied to any of the set of fins 54. As shown in FIG. 2B, a dummy poly-silicon layer 56 is then deposited over the silicon layer set of fins 54. As shown in FIG. 2C, a silicon nitride hardmask layer 58 will be deposited (e.g., via chemical vapor deposition). After such deposition, a first trench gate lithography process will be performed as shown in FIG. 2D. This process typically results in trench gates 60 (it is understood that this layer may be a tri-layer that includes organic dielectric layer (ODL) having a thickness of about 100 nm, silicon-containing anti-reflective coating (SiARC) having a thickness of about 35 nm, and resist having a thickness of about 100 nm.

Figure 2E:
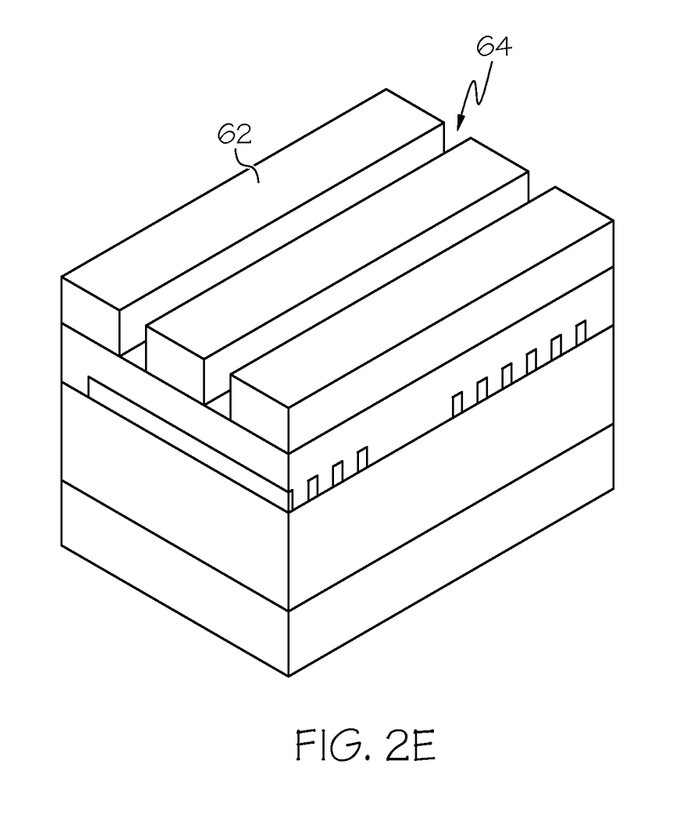
Figure 2F:
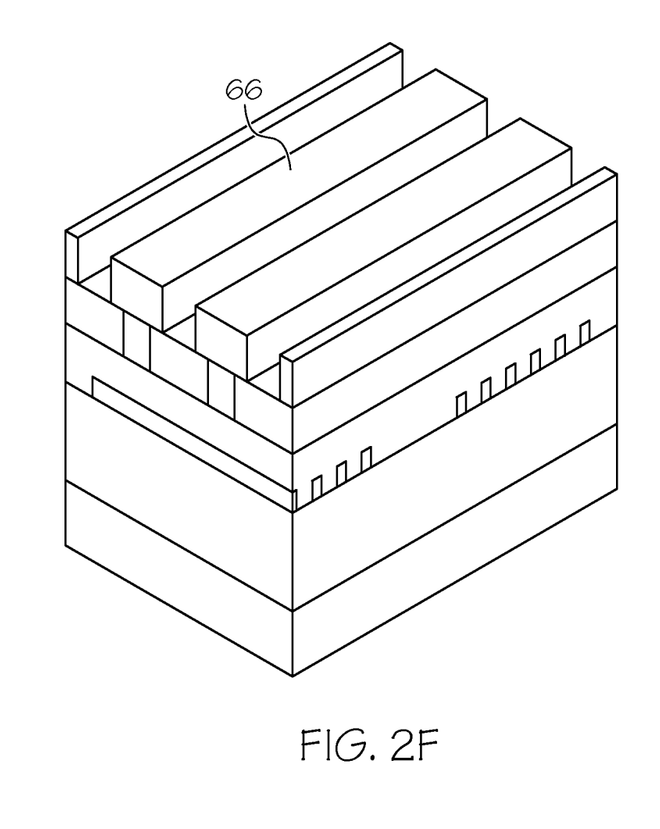
Figure 2G:
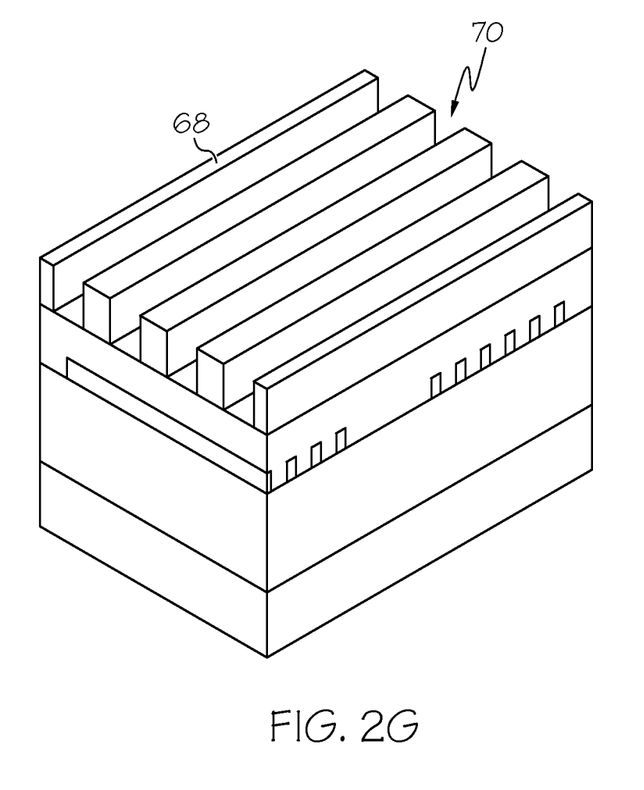
Figure 2H:
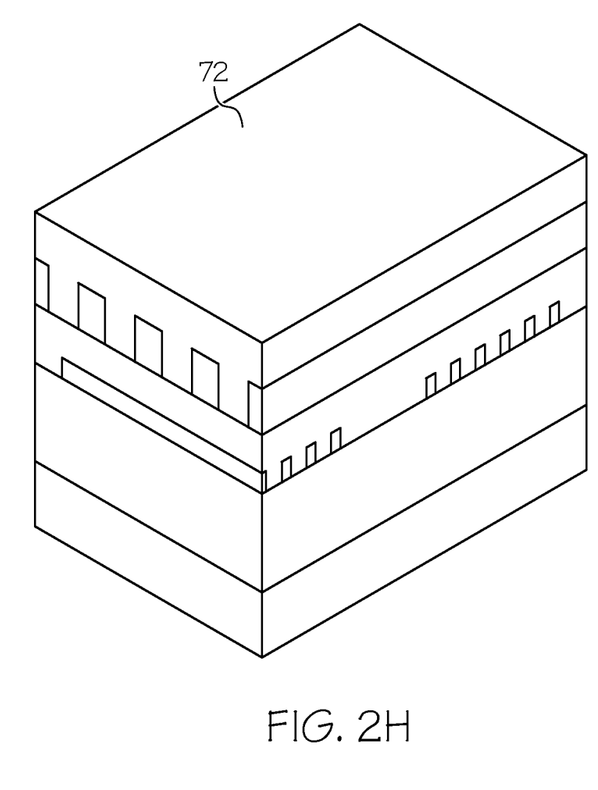
Figure 2I:
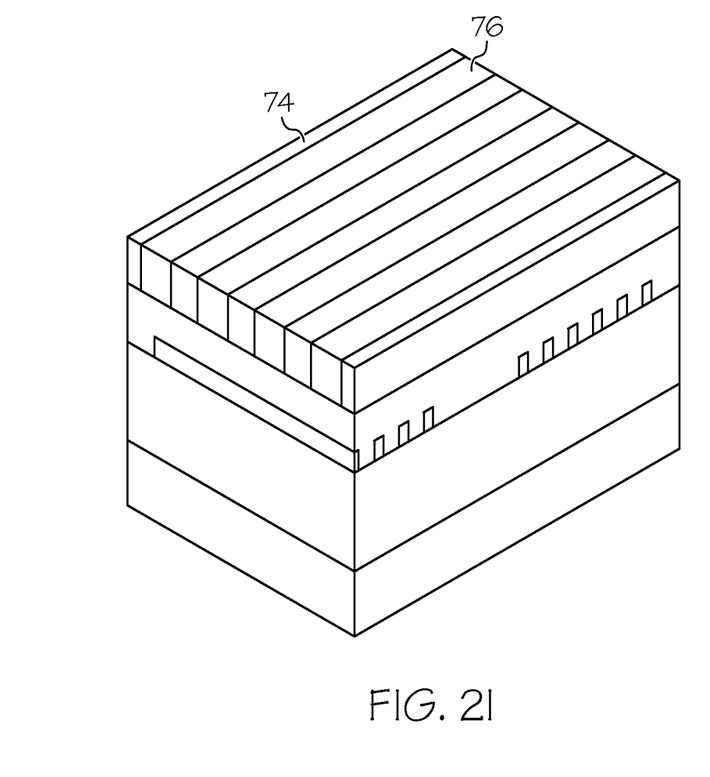
Figure 2J:
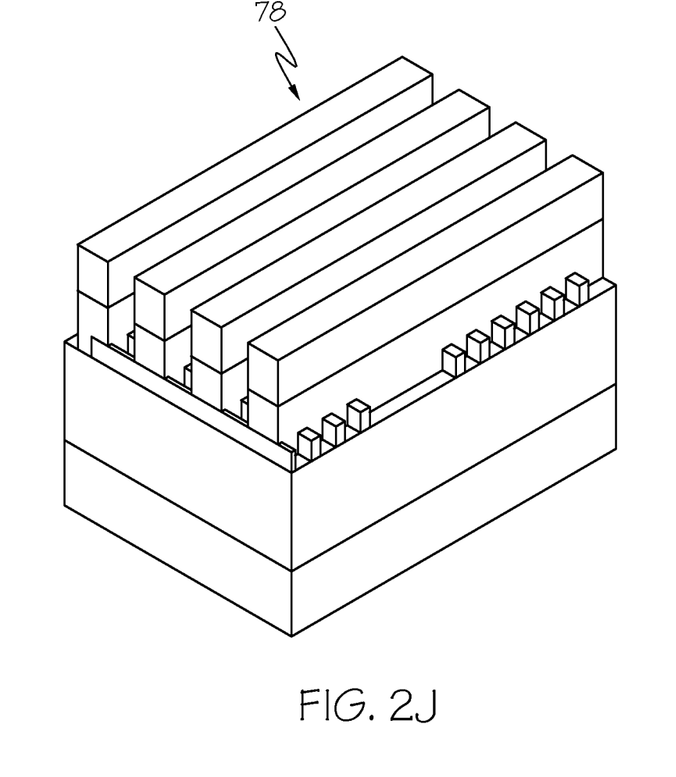

As shown in FIG. 2E, a first nitride hardmask etch will be performed to yield etched surface 62 and trenches 64. Trenches may then be filled as shown in FIG. 2F. Regardless, a second lithography process will be performed as shown in FIG. 2F to yield surface 66. Once the second lithography process has been performed, a second nitride hardmask etch process and resist/ODL strip will be performed as shown in FIG. 2G to yield surface 68 and trenches 70. As shown in FIG. 2H, an oxide layer 72 will then be deposited up to the hardmask layer to fill the trenches. Once the trenches have been filled, the oxide layer will be polished (e.g., "stop on nitride") as shown in FIG. 2I to planarize the device (e.g., surfaces 74 and 76 are relatively flush). Then, as shown in FIG. 2J, a selective nitride etch to the oxide layer will be performed. This process includes the etching of the poly-silicon layer, remaining oxide hardmask layer, and results in a poly-silicon gate patterning in device 78 as shown.

In various embodiments, design tools can be provided and configured to create the data sets used to pattern the semiconductor layers as described herein. For example, data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines, or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different order and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for forming a FinFET device, comprising:
defining a set of fins over a silicon layer;
forming a poly-silicon layer over the set of fins;
forming a hardmask layer over the poly-silicon layer;
performing a lithography-etch, lithography-etch process to form a set of trenches over the hardmask layer;
forming an oxide layer to fill the set of trenches;
polishing the oxide layer; and
selectively etching the FinFET device to yield a gate pattern.

2. The method of claim 1, further comprising oxidizing the set of fins.

3. The method of claim 1, the hardmask comprising silicon nitride, and being formed via chemical vapor deposition (CVD).

4. The method of claim 1, the lithography-etch, lithography-etch process comprising:
performing a first gate lithography over the hardmask layer;
performing a first etching after the first gate lithography;
performing a second gate lithography after the first etching; and
performing a second etching after the second gate lithography.

5. The method of claim 4, comprising performing a nitride fill-up after the first etching.

6. The method of claim 1, the polishing comprising chemical mechanical polishing.

7. The method of claim 1, the gate pattern comprising a poly-silicon gate pattern.

8. A method for forming a FinFET device, comprising:
defining a set of fins over a silicon layer, the silicon layer being formed over a buried oxide layer;
depositing a poly-silicon layer over the set of fins;
depositing a hardmask layer over the poly-silicon layer;
performing a lithography-etch, lithography-etch process to form a set of trenches over the hardmask layer;
filling the set of trenches with an oxide layer;
planarizing the oxide layer; and
selectively etching the FinFET device to yield a gate pattern.

9. The method of claim 8, further comprising oxidizing the set of fins.

10. The method of claim 8, the hardmask comprising silicon nitride, and being deposited via chemical vapor deposition (CVD).

11. The method of claim 8, the lithography-etch, lithography-etch process comprising:
performing a first gate lithography over the hardmask layer;
performing a first etching after the first gate lithography;
performing a second gate lithography after the first etching; and
performing a second etching after the second gate lithography.

12. The method of claim 11, comprising performing a nitride fill-up after the first etching.

13. The method of claim 8, the polishing comprising chemical mechanical polishing.

14. The method of claim 8, the gate pattern comprising a poly-silicon gate pattern.

15. A method for forming a FinFET device, comprising:
depositing a poly-silicon layer over a set of fins, the set of fins being formed over a silicon layer;
depositing a silicon nitride hardmask layer over the poly-silicon layer;
performing a front end of the line (FEOL) lithography-etch, lithography-etch process to form a set of trenches over the hardmask layer;
filling the set of trenches with an oxide layer;
planarizing the oxide layer; and
performing a selective nitride etching to yield a poly-silicon gate pattern in the device.

16. The method of claim 15, further comprising oxidizing the set of fins.

17. The method of claim 15, the lithography-etch, lithography-etch process comprising:
performing a first gate lithography over the hardmask layer;
performing a first etching after the first gate lithography;
performing a second gate lithography after the first etching; and
performing a second etching after the second gate lithography.

* * * * *

UNITED STATES PATENT AND TRADEMARK OFFICE
CERTIFICATE OF CORRECTION

PATENT NO.         : 8,716,094 B1
APPLICATION NO.    : 13/682769
DATED              : May 6, 2014
INVENTOR(S)        : Park et al.

It is certified that error appears in the above-identified patent and that said Letters Patent is hereby corrected as shown below:

Title Page: Item (73) Assignee:

Delete "Global Foundries Inc." and Insert -- GLOBALFOUNDRIES Inc. --.

Signed and Sealed this
Fifth Day of August, 2014

Michelle K. Lee
*Deputy Director of the United States Patent and Trademark Office*